United States Patent [19]
Durham et al.

[11] Patent Number: 6,133,758
[45] Date of Patent: Oct. 17, 2000

[54] SELECTABLE SELF-TIMED REPLACEMENT FOR SELF-RESETTING CIRCUITRY

[75] Inventors: Christopher McCall Durham; Peter J. Klim, both of Austin, Tex.

[73] Assignee: International Business Machines Corporation, Armonk, N.Y.

[21] Appl. No.: 09/086,737

[22] Filed: May 29, 1998

[51] Int. Cl.[7] .......................... H03K 19/00; H03K 19/096
[52] U.S. Cl. .................................. 326/93; 326/95; 326/98; 326/96; 326/97
[58] Field of Search .................................. 326/93, 95, 96, 326/97, 98

[56] References Cited

U.S. PATENT DOCUMENTS

| | | | |
|---|---|---|---|
| 5,565,798 | 10/1996 | Durham et al. | 326/93 |
| 5,790,560 | 8/1998 | Durham et al. | 371/22.1 |
| 5,870,411 | 2/1999 | Durham et al. | 371/22.5 |
| 5,912,900 | 6/1999 | Durham et al. | 371/22.1 |
| 5,939,898 | 8/1999 | Henkels et al. | 326/93 |
| 6,005,416 | 12/1999 | Beakes et al. | 326/96 |

*Primary Examiner*—Michael Tokar
*Assistant Examiner*—James H. Cho
*Attorney, Agent, or Firm*—Robert V. Wilder; Anthony V. S. England

[57] ABSTRACT

A method and apparatus is provided for changing a self-timed circuit into a self-resetting circuit to reduce the inherent delay of the self-timed circuit by an amount of latency between the assertion of the data and the assertion of the valid signal. Circuitry is provided to enable the effective de-coupling of the self-timing operation to enable data to move through the logic circuitry without the latency associated with the reception and generation of "valid" and "complete" signals being necessary. On the "receiving" side (the circuit being set into self-resetting mode), the logic circuit does not have to wait for the reception of the "valid" signals to begin operation. On the "driving" side (the circuit sending the data), the logic circuit does not have to wait for the "completion" signal to arrive to permit a new operation to occur.

15 Claims, 7 Drawing Sheets

SELECTABLE SELF-TIMED REPLACEMENT FOR SELF-RESETTING CIRCUITRY

RELATED APPLICATIONS

The present application is related to co-pending applications entitled "PMOS CHARGE SHARING PREVENTION DEVICE FOR DYNAMIC LOGIC CIRCUITS", Attorney Docket AT9-96-033, filed on Sept. 17, 1996, and "METHOD AND SYSTEM FOR TESTING SELF-TIMED CIRCUITRY", Attorney Docket AT9-96-081, filed on Dec. 13, 1996, both assigned to the assignee of the present application and included herein by reference.

FIELD OF THE INVENTION

The present invention relates generally to information processing systems and more particularly to a modification to a self-timed circuit to enable a self-resetting operation.

BACKGROUND OF THE INVENTION

Self-timed circuit techniques, which were once thought of only as research-oriented projects, are quickly becoming mainstream in VLSI (Very Large Scale Integration) circuitry applications. Self-timed circuits require no clocks for operation as do traditional systems. Self-timed circuits operate asynchronously on the simple concept of demand. That is, a self-timed circuit operates only when asked to, generates necessary outputs according to its own internal scheduling and presents the results to the requester. After performing its task, the self-timed circuit "goes to sleep" and awaits the next instruction or request. While in the sleep condition, no power is dissipated since no operation is taking place. This is contrary to traditional synchronous systems where even when a circuit is not needed, there is at least power dissipated by the clock circuitry running through the system. That idle power can be significant. Studies show that clocking power is approximately 30% of the overall power on a given VLSI circuit/chip. Consequently, self-timed circuits have at least a power advantage over traditional circuits.

Self-timed circuits also have significant advantages over other techniques such as so-called "self-resetting" circuits. Self-resetting circuits require no interaction between driving and receiving circuitry and create scheduling and arrival time conflicts and complications.

FIG. 1 shows an example of a self-timed logic unit 100 including a "circuit pipeline" of four self-timed logic circuits 101, 103, 105 and 107, respectively. In FIG. 1, each block within a self-timed logical unit 100 is labeled as a "Self-Timed Logic Circuit", and can itself be a combination of additional self-timed logic circuits. In operation, the input source or sources indicate to the self-timed logic unit 100 by asserting a request signal REQ and enabling data inputs (for example from a bus or multiple of bus signals) to the first self-timed logic circuit 101. The number of sources is shown as one for simplicity although the number of sources is not limited to one. The first Self-Timed Logic Circuit 101, notes that a request has been made and returns the acknowledge signal ACK to the source(s).

This signifies to the sources that the information on the data bus(es) has been received. The logic that drives the source signals is now free to de-assert the inputs and do other operations, etc., since the first self-timed logic circuit 101 has received the input information and has begun operating with that information.

The first self-timed logic circuit 101 operates on the data and produces a valid output signal 102 to a second self-timed logic circuit 103 and a third self-timed logic circuit 105, respectively, along with data results 106, from the operation of circuit 101. Circuit B 103 and C 105 receive the data or information and send "Complete" signals back along lines 110 and 112 to the first circuit 101 to signify capture of the incoming information. The first circuit 101 is now free to de-assert the output information, and, if necessary, receive further inputs from the input sources for the logical unit shown in FIG. 1.

In a similar manner, the second and third logic circuits 103 and 105 operate on the input information or data such circuits receive and produce a valid output signal and data results which are then sent to a fourth self-timed logic circuit "D" 107 in the present example. The fourth circuit 107 awaits for both "valid" signals to arrive from the second and third circuits 103 and 105, respectively, and then returns a "complete" signal back to the second and third circuits 103 and 105, respectively. The second and third circuits 103 and 105 are now able to de-assert their respective outputs and receive further information as necessary from the first self-timed logic circuit 101. The fourth circuit 107 operates on the information received and produces a "valid" output signal and associated data to an external sink (not shown) in the overall chip design. It is noted that sinks may be single or multiple depending on the particular architecture and placement of a self-timed logical unit. When the receiving units signify that the information has been received (by the assertion of the "completion" signals from sinks), the fourth self-timed logic circuit 107 may de-assert its outputs and receive further information from the second and third self-timed logic circuits 103 and 105, respectively. To control the above described operation, a circuit such as the control circuit shown in U.S. Pat. No. 5,565,798 may be used. U.S. Pat. No. 5,565,798 is hereby included herein by reference.

As a result of the above-described operation, it can be seen that in the general self-timed circuit, no registers are required. In a completely self-timed system, the combination of valid/complete cycles removes the necessity of synchronization of internal units and sub-blocks, as the units time and clock themselves. Holding registers normally used to hold data for synchronization with other functions would therefore be not required in a fully self-timed system. Self-timed circuits and systems actually synchronize themselves. Therefore in the limit, a completely self-timed microprocessor, for example, would require no on-chip or off-chip clocks.

However, there is a potential penalty associated with self-timed circuitry, i.e. at times a self-timed circuit must wait for a loop to complete before a new operation can begin. Also, a self-timed circuit may be forced to wait for the "valid" signal to arrive, which is typically slightly later than the arrival of the data associated with that "valid" signal. Consequently, using the self-timed approach removes the timing hazards associated with the self-resetting approach, but can come at a cost of some performance, mainly due to latency issues.

Accordingly, there is a need for an enhanced method and apparatus which is effective to provide improved performance from self-timed circuits by avoiding the latency which may be inherent in such circuits.

SUMMARY OF THE INVENTION

A method and apparatus is provided for changing a self-timed circuit into a self-resetting circuit to reduce the inherent delay of the self-timed circuit by an amount of latency between the assertion of the data and the assertion of the valid signal. In one embodiment, this is accomplished by selectively changing the control circuit to accommodate a self-resetting operation and override signal. When this occurs, the "hand-shaking" mechanism (self-timing) is removed and data moves through the logic circuit without the latency associated with the reception and generation of "valid" and "complete" signals being necessary.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
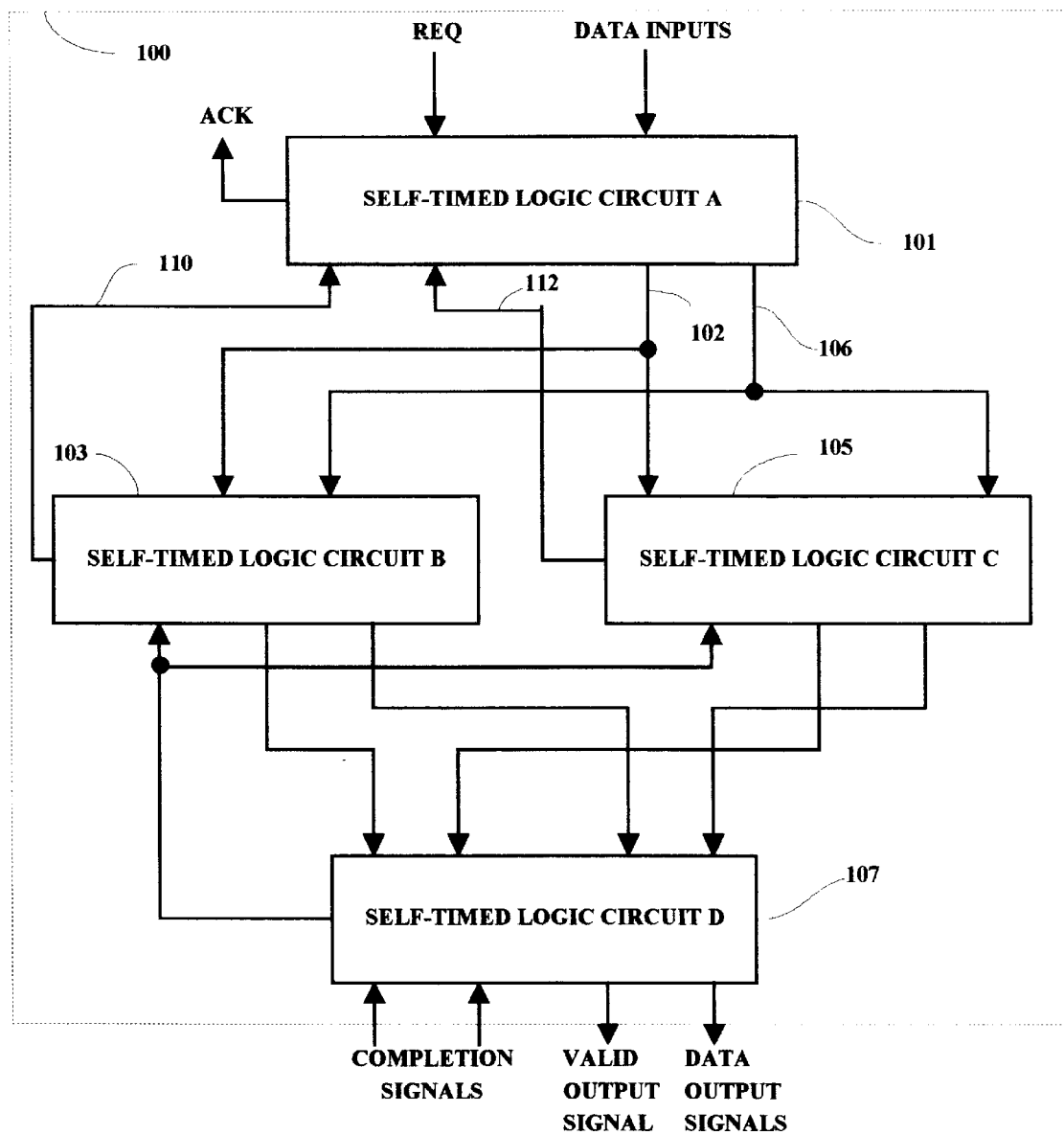
FIG. 1 is a schematic diagram showing a self-timed logic unit including a plurality of self-timed logic circuits.

As hereinbefore noted, FIG. 1 describes, in general block terms, a typical operation of a self-timed logic unit including a plurality of self-timed logic circuits. In FIG. 1, as well as the remaining Figures, like numerals refer to like parts and all of the illustrated components are not tagged with numeric indicia in order not to obfuscate the drawings or the description of the exemplary embodiments illustrated.

Figure 2A:
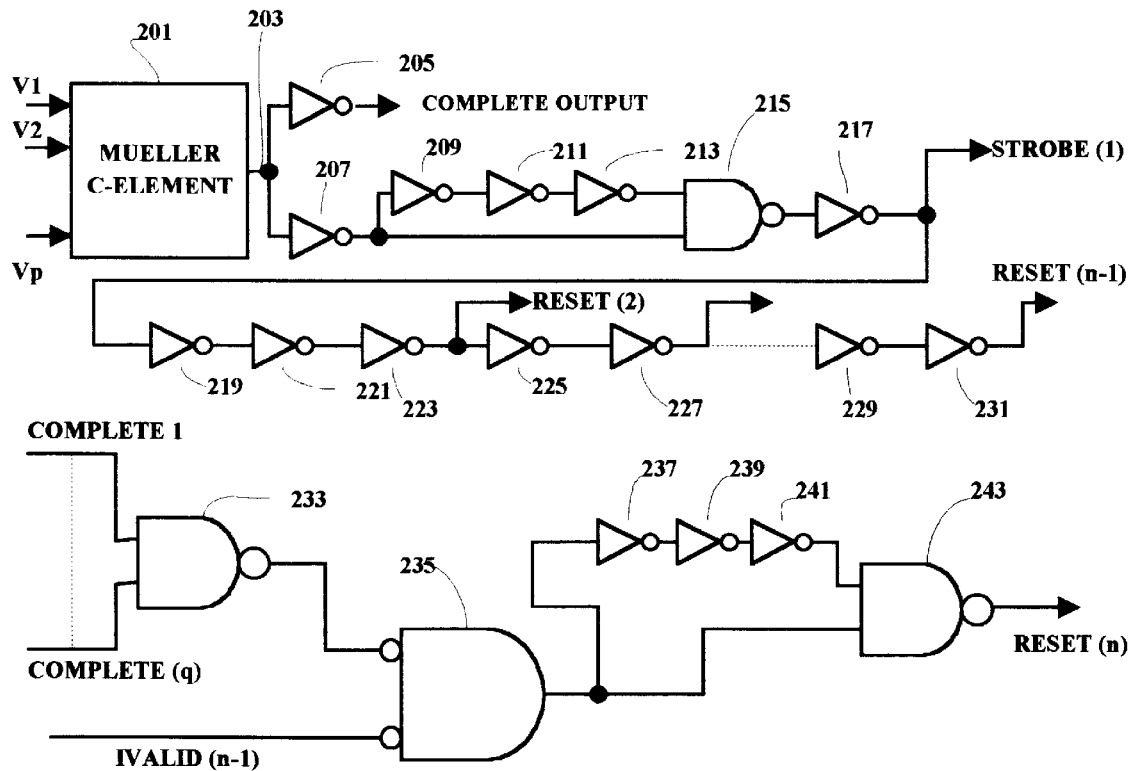
FIG. 2A is a schematic diagram of a self-timed control circuit.

In FIG. 2A, there is shown a Mueller C-Element circuit 201 which is arranged to receive a series of "valid" input signals V1, V2–Vp, and provide an output signal at node 203. Circuit 201 is an inverting C-element circuit and when all inputs are active, the output is low. The output remains low until all inputs return inactive at which time the output of circuit 201 will go to a high logic level. Thus when all data has been received from the macros inputting to the circuit 201, the output signal will go to a low logic level until all of the inputs V1–Vp return inactive. The valid input signals are representative that data signals to associated with each valid input signal are in a valid state and are being transmitted to the macro receiving the valid and related data signals from a preceding macro or functional circuit.

The Mueller circuit output is applied to an output node 203 which, in turn, is connected through an inverter 205 to provide a "complete output" signal. In general, inverter circuits are implemented as delay elements for signal timing purposes. The node 203 is also connected through a series of four inverters 207, 209, 211 and 213 to one input terminal of a two-input AND-NOT gate 215. The output of the inverter 207 is also applied directly to a second input of the gate 215. The output of the gate 215 is connected through an inverter 217 to provide a "Strobe (1)" output signal. The output of the inverter 217 is also connected through a series of three inverters 219, 221 and 223 to provide a "Reset (2)" signal at the output of the inverter 223. The output of inverter 223 is also connected through additional inverters 225, 227 through 231 which provides a "Reset (n–1)" output signal. AND-NOT gate 233 is shown receiving a series of input signals "Complete (1)"–"Complete (q)" and providing an output signal which is applied to one terminal of a two-input NOT-AND gate 235. The second input to the gate 235 is arranged to receive an "IVALID (n–1)" input signal. The output of gate 235 is connected through a series of three inverters 237, 239, and 241 to one input of an AND-NOT gate 243, the other input of which is connected directly to the output of gate 235. Gate 243 provides output signal "Reset (n)".

Figure 2B:
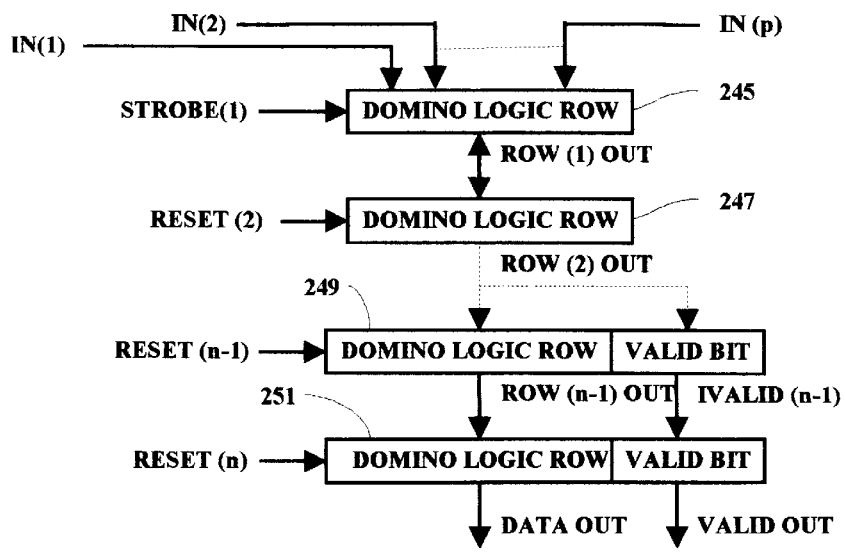
FIG. 2B is a further illustration of the circuit of FIG. 2A showing Domino Logic Rows.

FIG. 2B shows a series of Domino Logic Row circuits 245, 247, 249 and 251 which are coupled together and arranged to perform sequential logic functions on input data IN(1), IN(2)–IN(p), and provide data output signals "DATA OUT" and associated valid output signals "VALID OUT". As data is processed by each logic row, the logic row is reset after the processed data is transferred to the next logic row. The IVALID (n–1) signal shown in FIG. 2B is applied to the second input terminal of the gate 235 shown in FIG. 2A.

Figure 2C:
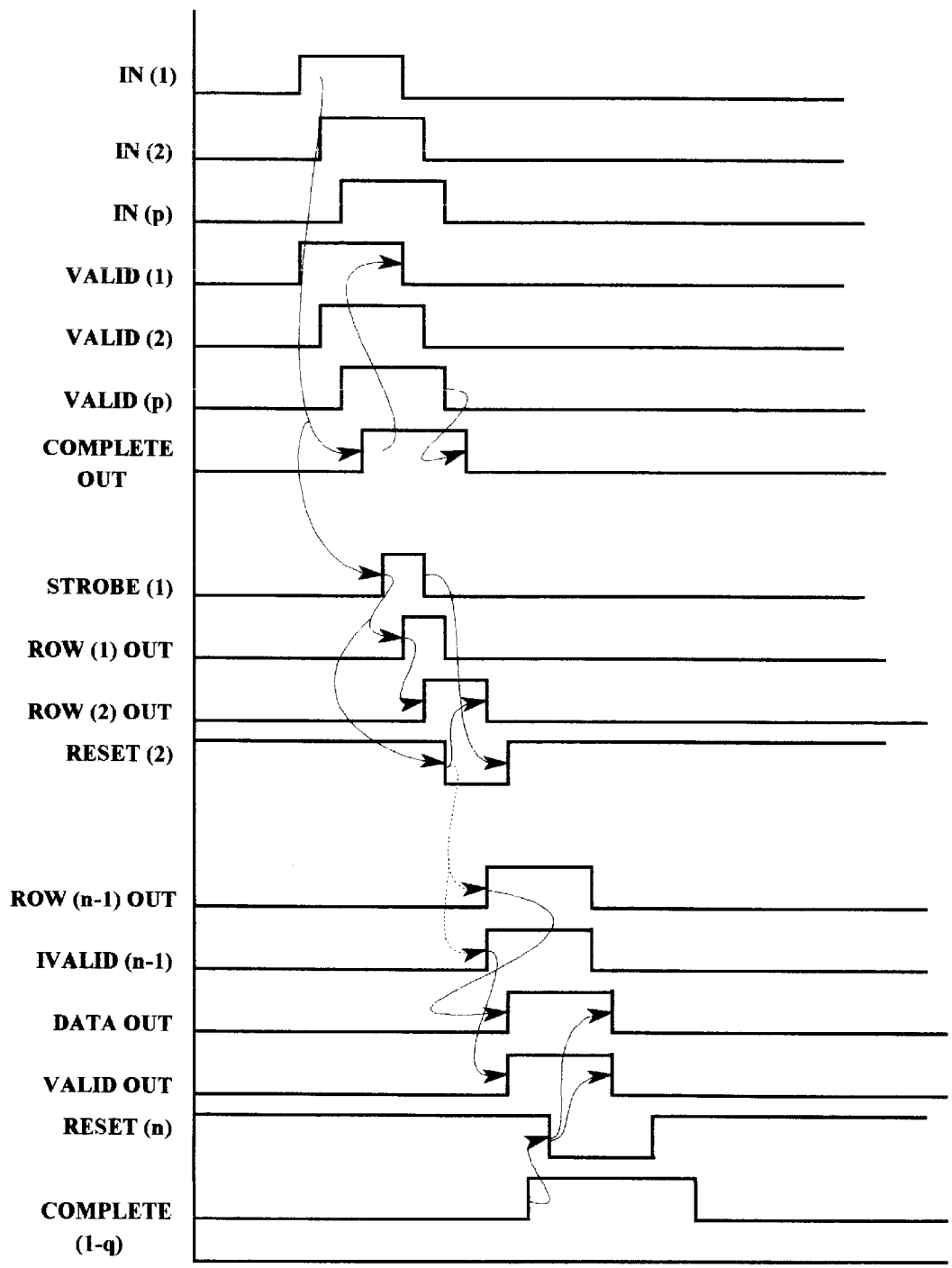
FIG. 2C is a timing chart illustrating the signal relationships within the circuit shown in FIGS. 2A and 2B.

In operation, reference is made to FIG. 2C which illustrates the timing relationships among the various signals in FIG. 2A and FIG. 2B. Signals IN(1)–IN(p) are inputs from p source logic circuits with associated valid signals VALID (1)–VALID(p), respectively. Signal COMPLETE OUT rises when all valid signals have risen. The rise of COMPLETE OUT signals each source logic circuit (1–p) that from the perspective of this sink, the output can be de-asserted. When each source circuit receives "complete" signals from all sinks, its "valid" output will fall. When all valid inputs fall, signal COMPLETE OUT falls. When all valid signals are high, signal STROBE(1) rises via "one-shot" created by delay inverters 209, 211 and 213, NAND gate 215 and driving inverter 217.

STROBE(1) rising samples the data on the inputs IN(1) –IN(p), and allows domino logic row 245 to evaluate the data, driving data to ROW(1) OUT. Domino Logic Row 245 returns to a precharged level when signal STROBE(1) returns low. Domino Logic Row 247 evaluates ROW(1) OUT data creating ROW(2) OUT.

STROBE(1) is delayed by inverters 219, 221 and 223 to produce signal RESET(2) which "resets" (precharges) Domino Logic Row 247 after evaluation occurs. This operation proceeds in sequence all the way through the stack of Domino Logic Rows until the next-to-last row (n–1) is reached.

At row "n–1", Domino Logic Row 249 evaluates its input data to produce ROW(n–1) OUT as in the previous rows. In parallel, Domino Logic Row 249 also produces an internal valid signal IVALID(n–1), closely mimicking the output signal, and sends this signal to NAND gate 235. Domino Logic Row 251 acts on signals ROW(n–1) OUT and IVALID(n–1) to produce outputs DATA OUT and VALID OUT, respectively. This data is sent to the "q" sinks for reception. Domino Logic Row 249 is now reset or precharged by signal RESET(n–1) as the previous rows. When all "q" sink circuits return their associated complete signals, i.e. COMPLETE(1–q), signal RESET (n) pulses low to reset or precharge Domino Logic Row 251. This happens via NAND gates 233 and 235 and the "one-shot" created by delay inverters 237, 239 and 241, and NAND gate 243. Signals DATA OUT and VALID OUT then fall or are de-asserted.

Figure 3:
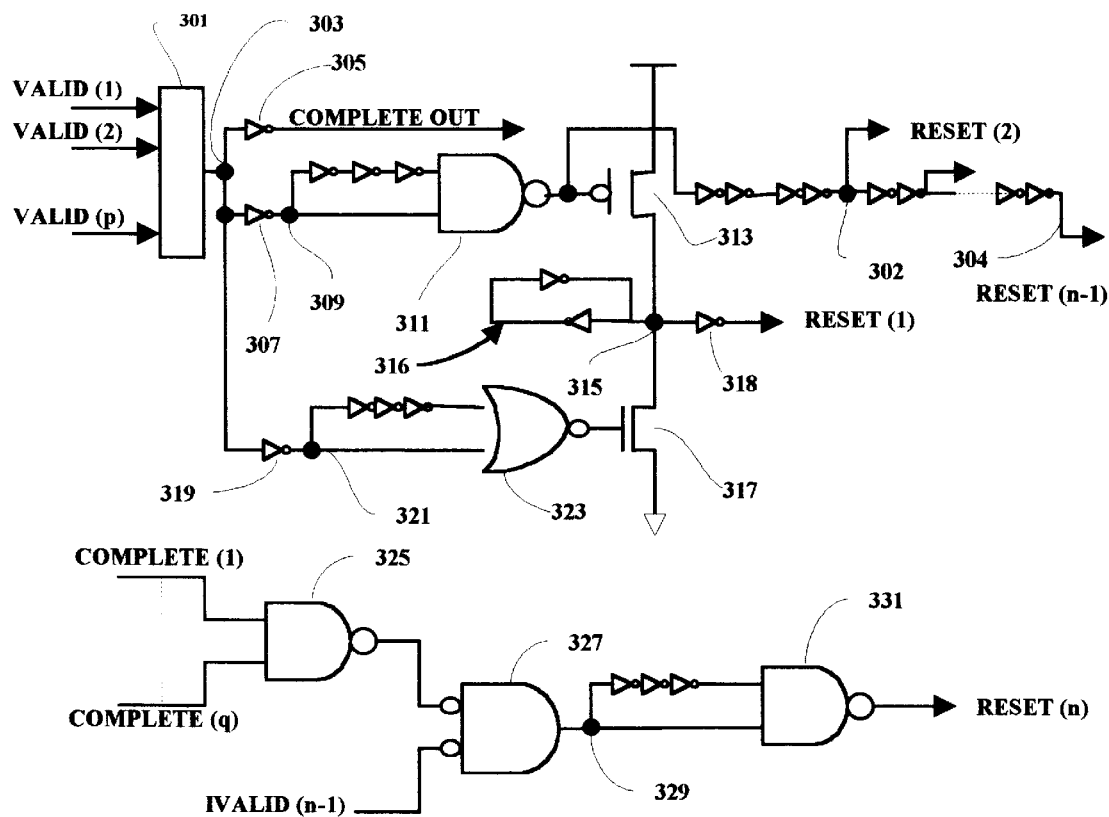
FIG. 3 is a schematic diagram of another self-timed logic control circuit.

FIG. 3 shows another exemplary embodiment of a self-timed logic control circuit. A series of valid signals Valid (1)–Valid (p) are applied to a Mueller C-element circuit 301 which provides an output to node 303. Node 303 is connected through an inverter 305 to provide an output signal Complete Out. Node 303 is also connected through an inverter 307 to a node 309, which in turn is connected through a series of three inverters to one input of a two-input AND-NOT gate 311. The other input terminal of the gate 311 is connected directly to the node 309. The output of the gate 311 is connected to the gate terminal of a PMOS device 313 which is connected between a high logic potential and a common node 315. The gate terminal of PMOS device 313 is also connected to the input of a series arrangement of four inverters to a RESET(2) node 302. Node 302 is further connected through further inverter circuits to provide a RESET(n–1) output 304. An NMOS device 317 is connected between node 315 and ground. The node 315 is also coupled to a latch circuit 316 and connected through an inverter 318 to provide a Reset (1) output signal.

Node 303 is also connected through an inverter 319 and a series of three additional inverters to one input of a two-input OR-NOT gate 323. The other input to the gate 323 is connected directly to the output of inverter 319. The output terminal of gate 323 is connected to the gate terminal of NMOS device 317. AND-NOT gate 325 is arranged to receive a series of "Complete" signals i.e. Complete (1) through Complete (q), and provide an output which is applied to one input of a two-input NOT-AND gate 327. The other input to gate 327 is arranged to receive input signal "IVALID (n–1)". The output of gate 327 is connected to node 329 which in turn is connected through a series of three inverters to one input terminal of a two-input AND-NOT gate 331. The other input terminal of gate 331 is connected directly to node 329. Gate 331 provides an output signal RESET (n).

The operation of the circuits in FIG. 2A, FIG. 2B and FIG. 3 is explained in further detail in the above identified U.S. Pat. No. 5,565,798, which has been included herein by reference.

Figure 4:
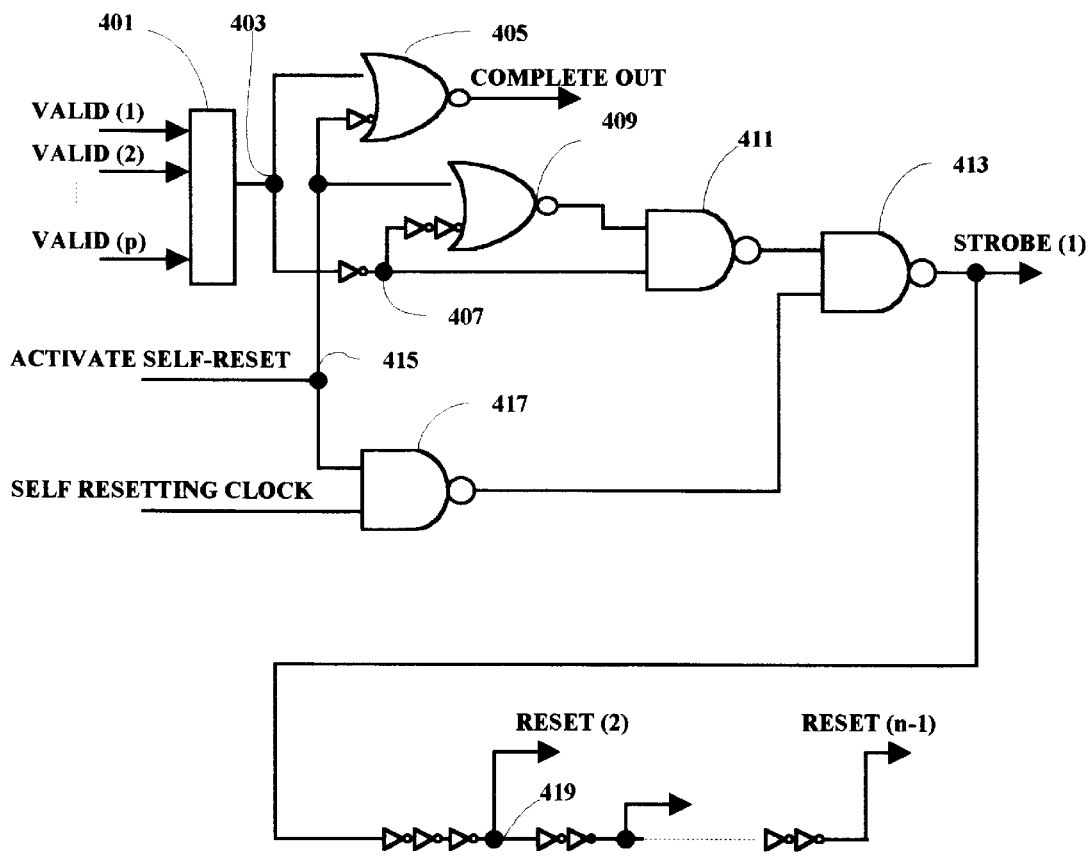
FIG. 4 is a schematic diagram of a modified self-timed control circuit of FIG. 2 including exemplary circuitry for permitting self-resetting control.

FIG. 4 is a schematic diagram of a modified self-timed control circuit of FIG. 2 including exemplary circuitry for permitting self-resetting control. The disclosed methodology enables post-manufacture application such that circuit hazardous and safe interfaces from a self-resetting standpoint can be selectively set at each self-timed logic circuit to provide the highest possible performance without the necessity of risking the entire design. That is, if one self-resetting logic is mis-designed or mis-aligned (due to process variations) and misses its interfacing signals (due to the self-resetting operation), then the entire chip design may be non-functional. However, the present technique allows the interfaces to follow the safe self-timed approach, but, selectively, to be set into the faster self-resetting approach.

In FIG. 4, a Mueller circuit 401 receives input signals Valid (1) through Valid (p) and applies an output to node 403. Node 403 is connected to one input of a two input OR-NOT gate 405, the output of which provides an output signal "COMPLETE OUT". Another input signal designated "ACTIVATE SELF-RESET" is applied to node 415 which is connected through an inverter circuit to the other input of gate 405. Node 415 is also connected to one input of another two input OR-NOT gate 409. Node 403 is connected through an inverter to a node 407 which is, in turn, connected through a series of two inverters to the other input to gate 409. The output of gate 409 is connected to one input of a two-input AND-NOT gate 411, the other input of which is connected to node 407. The output of gate 411 is applied to one input of a two input AND-NOT gate 413. A "SELF RESETTING CLOCK" signal is applied to one input of a two-input AND-NOT gate 417 and the other input to gate 417 is connected to node 415. The output of gate 417 is connected to an input of gate 413 the output of which provides signal "STROBE (1)". The output of gate 413 is also connected through a series of three inverters to provide a "RESET (2)" signal at node 419. Node 419 is also connected through additional pairs of inverters to ultimately provide signal "RESET (n–1)".

Figure 5:
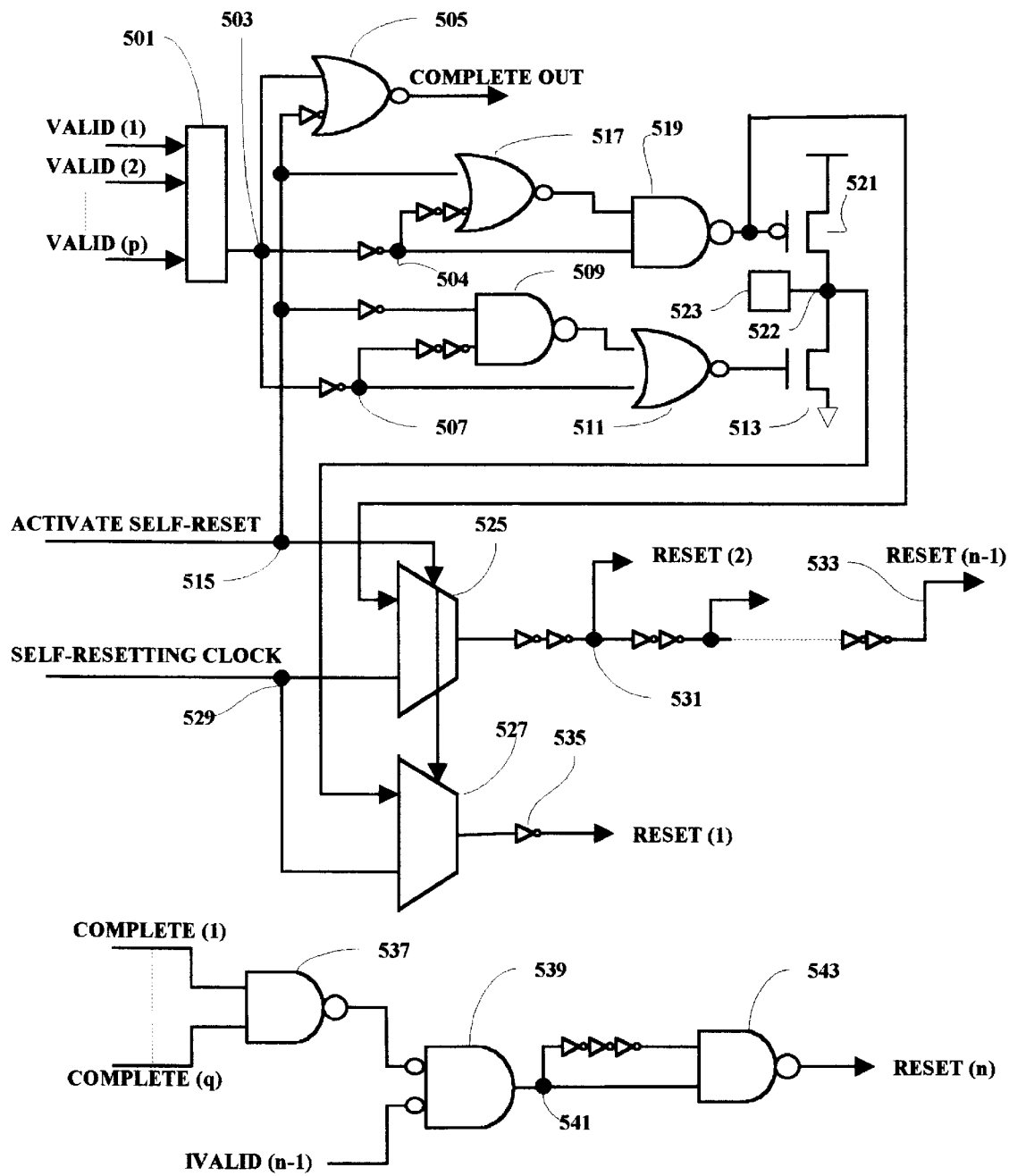
FIG. 5 is a schematic diagram of a modified self-timed control circuit of FIG. 3 including exemplary circuitry for permitting self-resetting control.

FIG. 5 is a schematic diagram of a modified self-timed control circuit of FIG. 3 including exemplary circuitry for permitting self-resetting control. In FIG. 5, a Meuller circuit 501 is arranged to receive a series of valid input signals "VALID (1)" through "VALID (p)". The output of the circuit 501 is connected to node 503, which in turn is connected to one input of a two-input OR-NOT gate 505. The output of gate 505 provides a "COMPLETE OUT" signal. Node 503 is also connected through an inverter to a node 504 which in turn is connected through a series of two additional inverters to one input of a two input OR-NOT gate 517. The output of gate 517 is connected to one input of a two-input AND-NOT gate 519. The other input to the gate 519 is connected directly to node 504. The output of gate 519 is connected to the gate terminal of a PMOS device 521, which is serially connected with NMOS device 513 between a high logic potential and ground. A latch circuit 523 is also coupled to a common point 522 between devices 521 and 513.

An "ACTIVATE SELF-RESET" signal is applied to a node 515 which in turn is connected through an inverter to the second input of gate 505 and also to the second input of gate 517. Node 515 is further connected through an inverter to one input of AND-NOT gate 509. Node 503 is connected through an inverter to another node 507 which in turn is connected through a series of two additional inverters to the other input of gate 509. The output of gate 509 is connected to one input of an OR-NOT gate 511, the other input of which is connected directly to node 507. The output of gate 511 is connected to the gate terminal of NMOS device 513.

The ACTIVATE SELF-RESET signal provides the select signal for first and second MUX devices 525 and 527, respectively. MUX circuit 525 receives one input from the gate terminal of the PMOS device 521 and MUX circuit 527 receives a first input from node 522. A "SELF-RESETTING CLOCK" signal is applied to node 529 which in turn is connected to the second terminals of both of the MUX circuits 525 and 527. The output of MUX circuit 527 is connected through an inverter 535 to provide a RESET (1) output. The output of MUX circuit 525 is connected through a series of two inverters to provide a RESET (2) signal and through further inverter circuits to provide a RESET (n–1) output 533.

A series of complete signals, "COMPLETE (1)"–"COMPLETE (q)", are applied to the input terminals of AND-NOT gate 537, the output of which is connected to one input terminal of a two-input NOT-AND gate 539. An "IVALID (n–1)" signal is applied to the other input to gate 539. The output of gate 539 is applied to node 541 and through a series of three inverters to one input of a two-input AND-NOT gate 543. The other input of gate 543 is connected directly to node 541. The output of gate 543 provides the RESET (n) signal.

Figure 6:
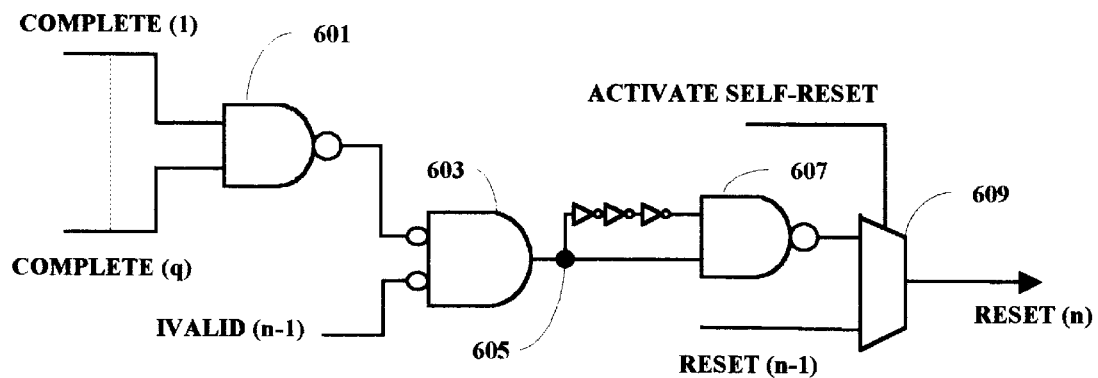
FIG. 6 is a schematic diagram illustrating another modification to a self-timed control circuit for precharge/reset of the last row.

FIG. 6 is a schematic diagram illustrating another exemplary modification to a self-timed control circuit for precharge/reset of the last row. In FIG. 6, a series of input signals COMPLETE (1) through COMPLETE (q) are applied to input terminals of an AND-NOT gate 601. The output of gate 601 is applied to one input of a two input NOT-AND gate 603, the other input terminal of which is arranged to receive signal IVALID (n−1). The output of gate 603 is connected to node 605 which in turn is connected through a series of three inverters to one input of a two-input AND-NOT gate 607. The other input terminal of gate 607 is connected directly to node 605. The output of gate 607 is connected to one input of a two input MUX circuit 609, the other input of which is arranged to receive a RESET (n−1) signal. The MUX circuit receives the ACTIVATE SELF-RESET signal at the MUX select terminal and the output of the MUX 609 provides a RESET (n) signal.

The operation of the circuits of FIG. 4 and FIG. 5 modifies the operation of the self-timed circuits of FIG. 2 and FIG. 3, respectively, by permitting an override to the self-timing operation which is effective to change the circuit operation to a self-resetting function. This occurs by virtue of the ACTIVATE SELF-RESET control line in conjunction with the SELF RESETTING CLOCK signal. The ACTIVATE SELF-RESET signal is a DC signal for each connected logic macro. The ACTIVATE SELF-RESET signal is set at "bring-up" of the part and is never logically transitioned during operation. The SELF-RESETTING CLOCK is an active high pulse generated from a self-resetting clock generation circuit such as the circuit shown in U.S. Pat. 5,550,490 which is included herein by reference. The SELF-RESETTING CLOCK signal looks like the reset signal as shown in FIG. 2C. The circuitry of FIG. 4 and FIG. 5 operates to selectively multiplex the SELF-RESETTING CLOCK into the clock control circuitry of FIG. 2A and FIG. 3, for example, when ACTIVATE SELF-RESET is high, as described below.

For FIG. 4, when the signal "COMPLETE OUT" is forced high, it means that the source macro resets of their last row are no longer required to wait on this macro. The "falling-edge-triggered" one-shot circuit (including inverters 237, 239, 241 and NAND gate 243 shown in FIG. 2B) is forced inactive. This means that the valid signal set can no longer initiate a reset/strobe cycle. The signals "STROBE (1) and RESET (2) to RESET (n−1) are now delayed or buffered versions of the self-resetting clock signal. This then means that the macro will use the self-resetting clock for operation.

For FIG. 5, when the signal COMPLETE OUT is forced high, the source macro resets of their last row are no longer required to wait on this macro. Both the "falling-edge-triggered one shot" and the "rising-edge-triggered one shot" are forced inactive. This means that the valid signal set can no longer initiate a reset/strobe cycle. Signals RESET (1), and RESET (2) through RESET (n−1) are now delayed or buffered versions of the self-resetting clock signal. This then means that the macro will use the self-resetting clock for operation. In both operations, the last row is not affected. This permits the last row of the macro to remain self-timed as the sink macros may not be operating as self-resetting circuits.

Furthermore, if all of the sink macros are operating in the self-resetting mode, then the COMPLETE input signals will all be high, which means then that the RESET (n) signals are now activated by the IVALID (n−1) signal and thus operate in a normal self-resetting mode. However, the dependency on the IVALID (n−1) signal does create an additional latency time for the reset of the last row. Note, then, that this is not an evaluation latency. To counteract that effect if desired to do so, the circuit of FIG. 6 can be used to replace the complete circuitry of FIG. 4 and FIG. 5. As a result of the additional control circuitry changes shown in FIG. 4 and FIG. 5, and, if desired, FIG. 6, the self-timed circuitry of FIG. 1, FIG. 2A and FIG. 3 can selectively operate in a self-resetting mode. This can potentially increase speed by decreasing latency. It should also be noted that the use of the disclosed technique permits any such designed macro to be switched from self-timed operation to self-resetting operation and back again. This permits any errors caused by the selective use of the self-resetting technique to be reverted back to the self-timed approach if desired.

The latency penalty associated with the strobing of the input data as shown in FIGS. 2A, 2B and 2C, can be selectively avoided on each logic circuit individually if the design and processing so allow. This means that the sources and sinks can be potentially de-coupled from the "hand-shaking" mechanism generated by the self-timing circuitry allowing the sources and sinks to operate as self-resetting. Note that although much more hazardous and error-prone, a selective use of the ACTIVATE SELF-RESET capability on individual chip circuits can significantly increase the overall speed of an application. This can also occur post-manufacture by multiplexing/decoding the activation signals.

Thus there has been provided a circuit technique end apparatus that permits a self-timed macro circuit to be selectively turned into a self-resetting circuit to potentially reduce latency times. This permits the selective use of the relatively more hazardous self-resetting circuit technique in areas where more performance could be gained via that construct. This approach modifies existing control circuitry in a simple manner to produce a more widely variable control circuit.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for selectively changing a relationship between logic circuit reset signals and processing of data signals through a series of n logic circuits, said processing being operable to provide a processed output signal from a final one of said n logic circuits, each of said n logic circuits being responsive to an associated logic circuit reset signal for being reset to a precharge state after processing said data signals, said method comprising:

providing control circuitry coupled to selected ones of said n logic circuits; and enabling a selective application of a control signal to said control circuitry, said control circuitry being responsive to said control signal for changing said relationship of said logic circuit reset signals and said data signals between a self-timed operational mode during which said reset signals are generated relative to a stage of said processing of said data signals, and a self-resetting operational mode during which said reset signals are generated relative to an applied self-resetting clock signal, whereby each of said n logic circuits in said series is selectively set to either said self-timed operational mode or said self resetting operational mode for processing of said data signals through said series of logic circuits to provide said processed output signal.

2. The method as set forth in claim 1 wherein said control circuit is responsive to a logic level of said control signal for determining said operational mode, and each of said n logic circuits in said series is selectively set to either said self-timed operational mode or said self-resetting operational mode independently of other logic circuits in said series.

3. The method as set forth in claim 1 wherein said control circuit is responsive to a first logic level of said control signal for enabling operation of said logic circuit in said self-timed operational mode.

4. The method as set forth in claim 3 wherein said control circuit is responsive to a second logic level of said control signal for enabling operation of said logic circuit in said self-resetting operational mode.

5. The method as set forth in claim 4 and further including:

applying said self-resetting clock signal to said logic circuit concurrently with said enabling.

6. The method as set forth in claim 1 wherein said control circuit is responsive to a logic level of said control signal for enabling operation of said logic circuit in said self-resetting operational mode.

7. The method as set forth in claim 6 and further including:

applying said self-resetting clock signal to said logic circuit concurrently with said enabling.

8. The method as set forth in claim 1 and further including:

de-coupling circuitry associated with said self-timed operational mode in response to said control signal.

9. The method as set forth in claim 8 and further including:

applying said self-resetting clock signal to said logic circuit in connection with said de-coupling.

10. A signal processing circuit comprising:

a series of n serially-connected logic circuits arranged to functionally process data signals input to a first of said logic circuits and provide a processed output signal from a last of said n logic circuits, each of said logic circuits being responsive to an associated logic circuit reset signal for being reset after processing said data signals;

means arranged to receive a self-resetting clock signal; and a control circuit coupled to said series of logic circuits, said control circuit being arranged for receiving a control signal, said control circuit being responsive to said control signal for changing a relationship between said logic circuit reset signals and said data signals between a self-timed operational mode during which said reset signals are generated relative to a stage of said processing of said data signals, and a self-resetting operational mode during which said reset signals are generated relative to said self-resetting clock signal, whereby each of said n logic circuits in said series is selectively set to either said self-timed operational mode or said self resetting operational mode for processing of said data signals through said series of logic circuits to provide said processed output signal.

11. The logic circuit as set forth in claim 10 wherein said control circuit is responsive to a logic level of said control signal for determining said operational mode, and each of said n logic circuits in said series is selectively set to either said self-timed operational mode or said self-resetting operational mode independently of other logic circuits in said series.

12. The logic circuit as set forth in claim 10 wherein said control circuit is responsive to a first logic level of said control signal for operating said logic circuit in said self-timed operational mode.

13. The logic circuit as set forth in claim 12 wherein said control circuit is responsive to a second logic level of said control signal for enabling operation of said logic circuit in said self-resetting operational mode.

14. The logic circuit as set forth in claim 10 wherein said control circuit is responsive to a logic level of said control signal for enabling operation of said logic circuit in said self-resetting operational mode.

15. The logic circuit as set forth in claim 10 and further including:

switching means for de-coupling circuitry associated with said self-timed operational mode in response to said control signal.

* * * * *